(12) United States Patent
Campbell et al.

(10) Patent No.: US 10,957,623 B2
(45) Date of Patent: Mar. 23, 2021

(54) THERMAL INTERFACE MATERIAL STRUCTURES INCLUDING PROTRUDING SURFACE FEATURES TO REDUCE THERMAL INTERFACE MATERIAL MIGRATION

(71) Applicant: International Business Machines Corporation, Armonk, NY (US)

(72) Inventors: Eric J. Campbell, Rochester, MN (US); Sarah K. Czaplewski-Campbell, Rochester, MN (US); Elin F. LaBreck, Rochester, MN (US); Jennifer I. Bennett, Rochester, MN (US)

(73) Assignee: International Business Machines Corporation, Armonk, NY (US)

(\*) Notice: Subject to any disclaimer, the term of this patent is extended or adjusted under 35 U.S.C. 154(b) by 0 days.

(21) Appl. No.: 16/293,762

(22) Filed: Mar. 6, 2019

(65) Prior Publication Data

US 2019/0198425 A1 Jun. 27, 2019

Related U.S. Application Data

(62) Division of application No. 15/491,312, filed on Apr. 19, 2017, now Pat. No. 10,319,666.

(51) Int. Cl.
*H01L 23/42* (2006.01)
*H01L 23/367* (2006.01)
*H01L 23/10* (2006.01)

(52) U.S. Cl.
CPC ............. *H01L 23/42* (2013.01); *H01L 23/10* (2013.01); *H01L 23/367* (2013.01)

(58) Field of Classification Search
CPC ....... H01L 23/10; H01L 23/367; H01L 23/42; H01L 23/36–3675; H01L 23/3736
See application file for complete search history.

(56) References Cited

U.S. PATENT DOCUMENTS 6,294,408 B1 9/2001 Edwards et al.
7,663,227 B2 2/2010 Macris
(Continued)

OTHER PUBLICATIONS

List of IBM Patents or Patent Applications Treated as Related, Mar. 5, 2019, 2 pgs.

*Primary Examiner* — Laura M Menz
*Assistant Examiner* — Candice Chan
(74) *Attorney, Agent, or Firm* — Jared L. Montanaro

(57) ABSTRACT

Forming a thermal interface material structure includes forming an assembly that includes a thermal interface material disposed between a first mating surface and a second mating surface. The first mating surface is associated with a module lid, and the second mating surface is associated with a heat sink. Protruding surface features are incorporated onto the first mating surface or the second mating surface. The process also includes compressing the assembly to form a thermal interface material structure. The thermal interface material structure includes the thermal interface material disposed within an interface defined by the first mating surface and the second mating surface. The protruding surface features protrude from the first mating surface or the second mating surface into selected areas of the interface to limit relative movement of the mating surfaces into the selected areas during thermal cycling to reduce thermal interface material migration out of the interface.

5 Claims, 5 Drawing Sheets

(56) References Cited

U.S. PATENT DOCUMENTS

| | | |
|---|---|---|
| 7,803,664 B2 | 9/2010 | Colgan et al. |
| 7,863,731 B2 | 1/2011 | Chen et al. |
| 8,487,428 B2 | 7/2013 | Lee |
| 8,653,651 B2 | 2/2014 | Uchida et al. |
| 9,230,878 B2* | 1/2016 | Baker .................... H01L 23/42 |
| 9,460,983 B2 | 10/2016 | Horiuchi et al. |
| 2003/0153667 A1 | 8/2003 | Jayaraman et al. |
| 2008/0230893 A1* | 9/2008 | Too .................... H01L 23/04 |
| | | 257/704 |
| 2008/0296757 A1* | 12/2008 | Hoffman ................ H01L 24/32 |
| | | 257/713 |
| 2009/0127701 A1* | 5/2009 | Goel .................... H01L 23/42 |
| | | 257/713 |
| 2010/0327432 A1* | 12/2010 | Sirinorakul ......... H01L 23/3107 |
| | | 257/712 |
| 2011/0042784 A1 | 2/2011 | Edwards et al. |
| 2015/0303129 A1 | 10/2015 | Ouderkirk et al. |
| 2018/0308782 A1 | 10/2018 | Campbell et al. |

\* cited by examiner

THERMAL INTERFACE MATERIAL STRUCTURES INCLUDING PROTRUDING SURFACE FEATURES TO REDUCE THERMAL INTERFACE MATERIAL MIGRATION

BACKGROUND

In an electronic device, a thermal interface material (also referred to as a "TIM") is a material (e.g., a grease or a putty) that is disposed between a heat generating component of an electronic device (e.g., a die, a memory component, an inductor, etc.) and a heat dissipating component (e.g., a heat spreader or a heat sink) in order to facilitate efficient heat transfer between the heat generating component and the heat dissipating component. The powering up or powering down of the electronic device may cause temperature changes which may cause a relative motion between the heat generating component and the heat dissipating component, including in-plane motion and out-of-plane motion due to coefficient of thermal expansion (CTE) mismatch. This relative motion may cause the thermal interface material to squeeze out of the interface gap. This phenomenon is commonly referred to as "pump-out" of the thermal interface material and results in increased thermal resistance due to loss of material from the interface.

SUMMARY

According to an embodiment, a process of forming a thermal interface material structure is disclosed. The process includes forming an assembly that includes a thermal interface material disposed between a first mating surface and a second mating surface. The first mating surface is associated with a module lid, and the second mating surface is associated with a heat sink. Protruding surface features are incorporated onto the first mating surface or the second mating surface. The process also includes compressing the assembly to form a thermal interface material structure. The thermal interface material structure includes the thermal interface material disposed within an interface defined by the first mating surface and the second mating surface. The protruding surface features protrude away from the first mating surface or the second mating surface into selected areas of the interface to limit relative movement of the first mating surface and the second mating surface into the selected areas during thermal cycling to reduce thermal interface material migration out of the interface.

According to another embodiment, an electronic component cooling assembly is disclosed that includes an electronic component, a module lid, a heat sink, and a thermal interface material. The module lid forms a heat spreader surrounding the electronic component, and the module lid has surface features protruding away from a module lid mating surface. The heat sink has a heat sink mating surface, and the thermal interface material is disposed within an interface between the module lid mating surface and the heat sink mating surface. The surface features protrude away from the module lid mating surface into selected areas of the interface to limit relative movement of the mating surfaces into the selected areas during thermal cycling in order to reduce migration of the thermal interface material out of the interface.

According to another embodiment, an electronic component cooling assembly is disclosed that includes an electronic component, a module lid, a heat sink, and a thermal interface material. The module lid forms a heat spreader surrounding the electronic component, and the module lid has a module lid mating surface. The heat sink has surface features that protrude away from a heat sink mating surface, and the thermal interface material is disposed within an interface between the module lid mating surface and the heat sink mating surface. The surface features protrude away from the heat sink mating surface into selected areas of the interface to limit relative movement of the mating surfaces into the selected areas during thermal cycling of the electronic component in order to reduce migration of the thermal interface material out of the interface.

The foregoing and other objects, features, and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

The present disclosure describes thermal interface material (TIM) structures that include protruding surface features to reduce TIM migration (also referred to as "TIM pumping" or "TIM pump-out"). The thermal interface material structures of the present disclosure incorporate surface features onto a particular mating surface, such that the features protrude into selected areas of an interface (including a thermal interface material, such as a thermal grease or putty) separating the particular mating surface from another mating surface. In some cases, the protruding features may be incorporated onto a mating surface of a heat spreader (also referred to herein as a module lid) that surrounds an electronic component (also referred to herein as a lidded module) and distributes heat away from the electronic component. In other cases, the protruding features may be incorporated onto a mating surface of a heat sink that overlies the module lid and is separated from the module lid by the interface (that includes the thermal interface material).

During thermal cycling, a CTE mismatch between the module lid and the heat sink may cause relative motion (in-plane and out-of-plane) between the module lid and the heat sink. By incorporating surface features that protrude from a mating surface into selected areas of the interface, the potential relative movement of the mating surfaces in the selected areas may be limited. Limiting the relative movement may reduce strain on the thermal interface material in areas of the interface proximate to the protruding features. Reducing the strain on the thermal interface material may reduce the potential for TIM pump-out and the associated increase in thermal resistance due to loss of material from the interface.

Figure 1:
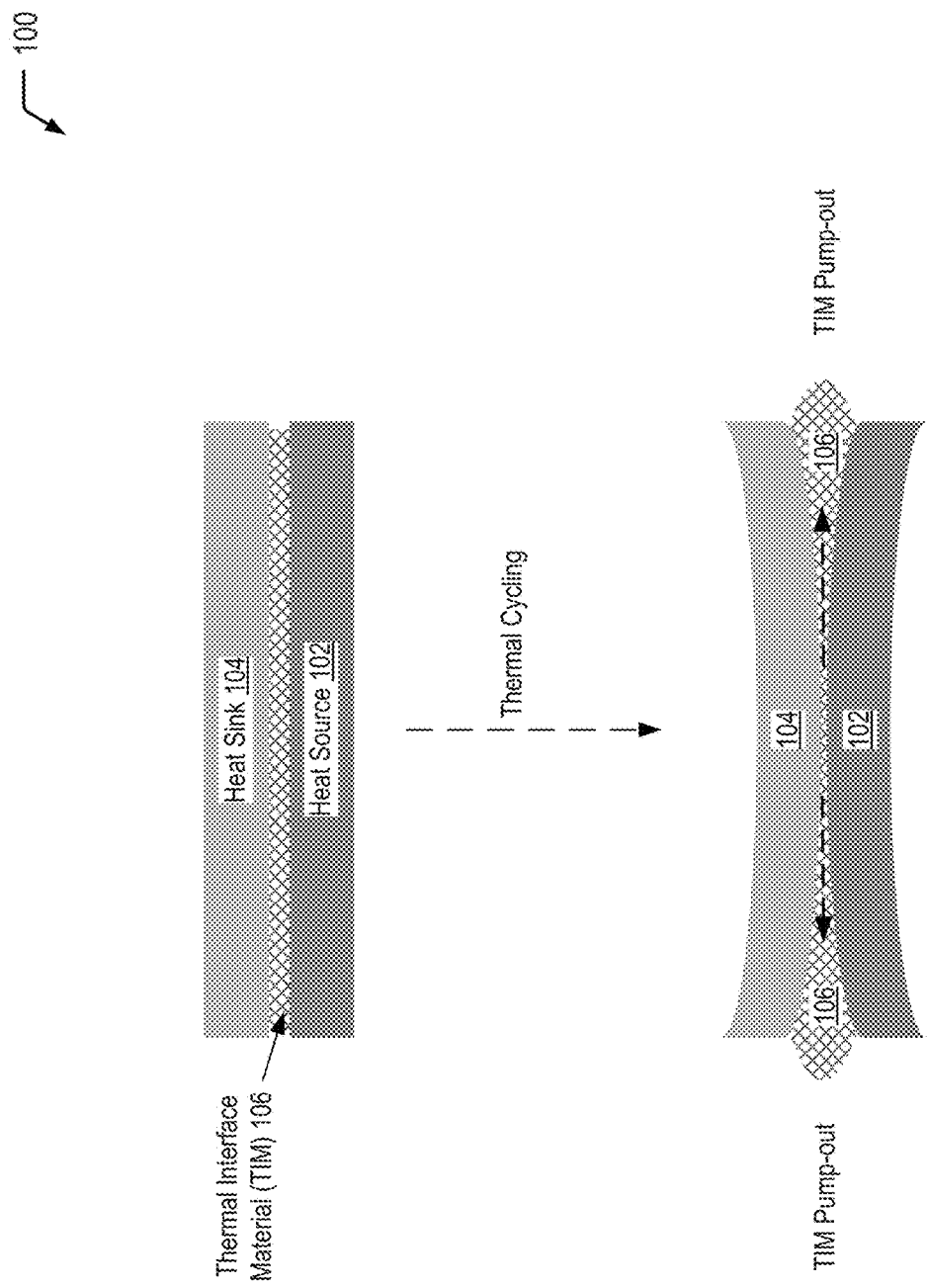
FIG. 1 is a prior art diagram illustrating that excessive relative movement of a heat generating component and a heat dissipating component during thermal cycling may cause pump-out of thermal interface material.

Referring to FIG. 1, a prior art diagram 100 illustrates a heat source 102 (e.g., an integrated circuit or other heat-generating component of an electronic device) that dissipates heat using a heat sink 104 that is joined to the heat source 102 by a thermal interface material 106, such as a thermal grease or a thermal putty. The top portion of FIG. 1 illustrates that compressing the thermal interface material 106 between the heat source 102 and the heat sink 104 may fill an interface gap between a mating surface of the heat source 102 and a mating surface of the heat sink 104 in order to form an interface for efficient removal of heat from the heat source 102 via the heat sink 104.

The heat source 102 and the heat sink 104 may correspond to different materials that have different CTE values. The bottom portion of FIG. 1 illustrates that, due to the CTE mismatch between the heat source 102 and the heat sink 104, thermal changes associated with thermal cycling (e.g., powering up or powering down of an electronic device) cause relative movement (in-plane and out-of-plane) of the heat source 102 and the heat sink 104. To illustrate, during thermal cycling, the heat source 102 may bow upward into a central area of the interface, and the heat sink 104 may bow downward into the central area of the interface, resulting in a significant reduction of interface thickness between the heat source 102 and the heat sink 104 in the central area of the interface. The resulting strain may cause the thermal interface material 106 to migrate away from the central area of the interface over time, identified as TIM pump-out by the dashed lines of FIG. 1. Pump-out of the thermal interface material 106 results in increased thermal resistance due to loss of material from the interface.

By contrast, the thermal interface material structures of the present disclosure incorporate surface features onto a mating surface of a particular heat transfer component of an electronic component cooling assembly that includes two heat transfer components (e.g., a heat spreader and a heat sink) separated by an interface that includes a thermal interface material (e.g., a thermal grease or putty). The heat spreader surrounds an electronic component and distributes heat away from the electronic component. The heat spreader is also referred to herein as a module lid, and the electronic component within the heat spreader is also referred to herein as a lidded module. In some cases, the surface features may be incorporated onto a mating surface of the heat spreader, as further described with respect to the example depicted FIG. 2. In other cases, the surface features may be incorporated onto a mating surface of the heat sink, as further described with respect to the example depicted FIG. 3.

The surface features protrude from the mating surface of the particular heat transfer component into selected areas of the interface. As described further herein, the protruding features may limit the relative movement of the mating surfaces in the selected areas of the interface during thermal cycling due to CTE mismatch. Limiting the relative movement may reduce strain on the thermal interface material in areas of the interface proximate to the protruding features. Reducing the strain on the thermal interface material may reduce the potential for TIM pump-out and the associated increase in thermal resistance due to loss of material from the interface.

Figure 2:
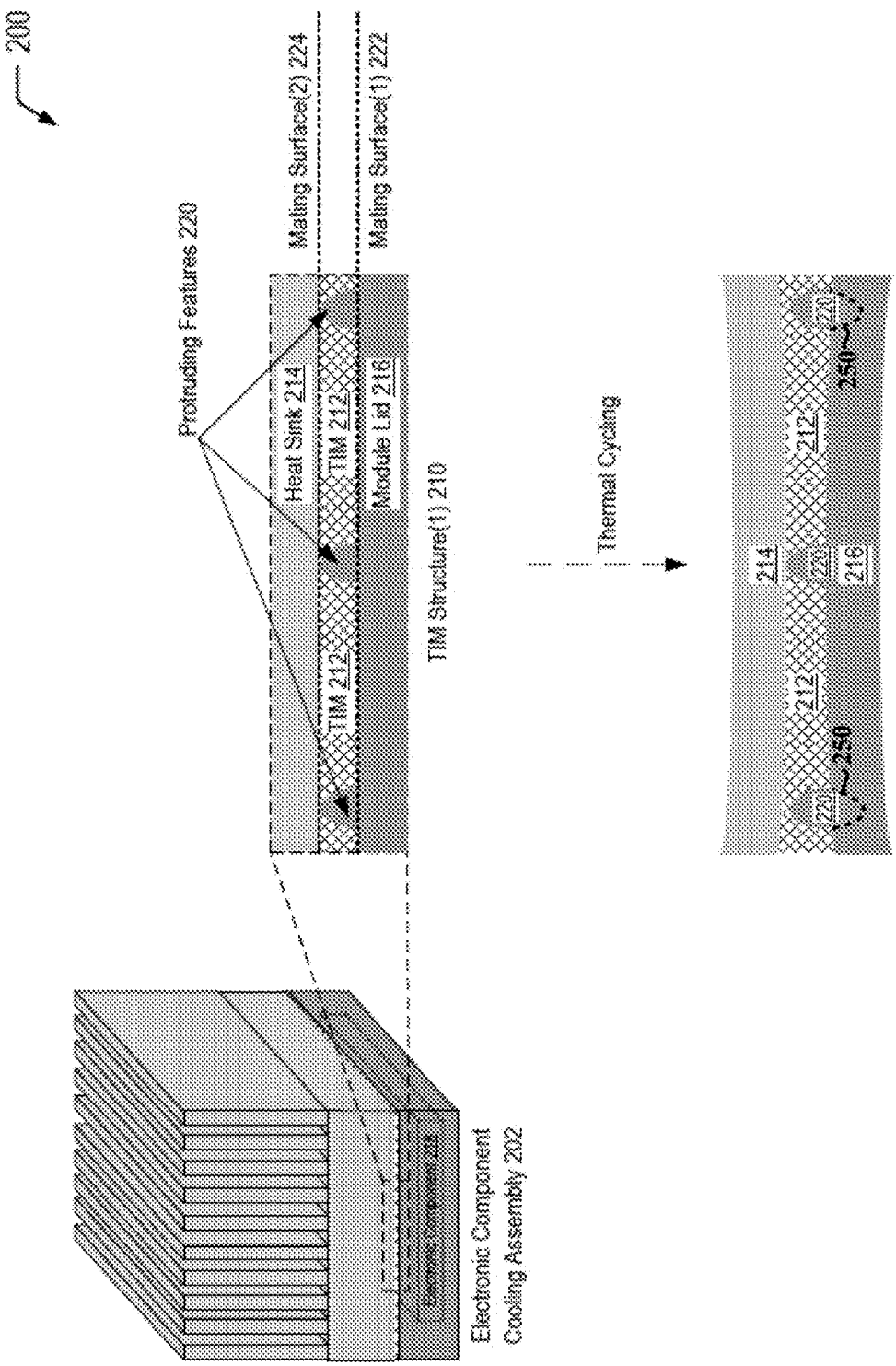
FIG. 2 is a diagram illustrating an example of a thermal interface material structure in which protruding features are incorporated onto a module lid mating surface in order to reduce pump-out of thermal interface material by preventing excessive relative movement during thermal cycling, according to one embodiment.

Referring to FIG. 2, a diagram 200 illustrates an electronic component cooling assembly 202 that includes an example of a first TIM structure 210 of the present disclosure (identified as "TIM Structure(1)" in FIG. 2), according to one embodiment. The electronic component cooling assembly 202 is illustrated in a perspective view on the left side of FIG. 2, and a selected portion of the electronic component cooling assembly 202 that includes the first TIM structure 210 is illustrated in a cross-sectional view on the right side of FIG. 2. The cross-sectional view illustrates that the first TIM structure 210 includes a thermal interface material 212 (e.g., a thermal grease or putty) that forms an interface between a heat sink 214 and a module lid 216. The perspective view illustrates that the module lid 216 corresponds to a heat spreader surrounding an electronic component 218 that distributes heat generated by the electronic component 218 during operation. To illustrate, the electronic component 218 may include a die, a central processing unit (CPU), a graphics processing unit (GPU), or a field programmable gate array (FPGA), among other alternatives. The first TIM structure 210 of FIG. 2 represents an example in which protruding features 220 (also referred to herein as "bumps") are incorporated onto a module lid mating surface 222 (identified as "Mating Surface(1)" in FIG. 2) in order to reduce or eliminate pump-out of the thermal interface material 212 by preventing excessive relative movement of the module lid 216 and the heat sink 214 during thermal cycling, such as the excessive relative movement depicted in the prior art diagram 100 of FIG. 1. Alternatively or additionally, protruding features may be incorporated onto a heat sink mating surface 224 (identified as "Mating Surface(2)" in FIG. 2), as illustrated and further described herein with respect to FIG. 3.

In the particular embodiment depicted in FIG. 2, the protruding features 220 are incorporated onto the module lid 216 and protrude out from the module lid mating surface 222 into selected areas of the interface between the module lid mating surface 222 and the heat sink mating surface 224. In a particular embodiment, the protruding features 220 may be incorporated onto the module lid 216 through a forming process during manufacturing of the module lid 216. In another embodiment, channels may be machined, as indicated by residual lines 250, or otherwise incorporated into the module lid 216, and the channels may be filled with a material that is appropriate for the module lid 216 in order to form the protruding features 220. In some cases, the module lid 216 may be formed from a module lid material, such as a nickel-based material, a copper-based material, an aluminum-based material, or any combination thereof, among other alternative materials. As an illustrative, non-limiting example, when the module lid 216 is formed from a nickel-based material, the channels may be filled with a nickel-based material that is the same as the nickel-based material of the module lid 216 or that is substantially similar to the nickel-based material of the module lid 216. Alternatively, with respect to the example in which the module lid 216 is formed from a nickel-based material, the channels may be filled with other material(s) compatible with the nickel-based material for efficient transfer of heat away from the module lid 216 into the thermal interface material 212.

The bottom portion of FIG. 2 illustrates that the protruding features 220 may prevent excessive relative movement of the module lid 216 and the heat sink 214 during thermal cycling. In the particular embodiment illustrated in FIG. 2, the protruding features 220 are positioned in a central area of the interface separating the module lid 216 and the heat sink 214. During thermal cycling, the module lid 216 may bow upward into the central area of the interface, and the heat sink 214 may bow downward into the central area of the interface. As previously described herein with respect to the prior art diagram 100 of FIG. 1, this may result in a significant reduction of interface thickness in the central area. By positioning the protruding features 220 in the central area of the interface, the potential reduction of interface thickness in the central area is limited by a distance that the protruding features 220 extend into the interface from the module lid mating surface 222.

FIG. 2 depicts an illustrative, non-limiting example in which the protruding features 220 include three protruding features that are distributed substantially uniformly along the module lid mating surface 222 in the central area of the interface. Further, FIG. 2 illustrates an example in which each of the protruding features 220 has a substantially similar shape (e.g., a bump shape). It will be appreciated that the number of protruding features 220, the position/distribution of protruding features 220 on the module lid mating surface 222, the size/shape of each of the protruding features 220, or a combination thereof, may vary. As an example, in some cases, the protruding features 220 may be "strategically" patterned based on characteristics of the individual components of the electronic component cooling assembly 202, such as characteristics of the heat sink 214 and/or characteristics of the module lid 216, among other possible factors. As another example, when the module lid 216 is from a first manufacturer, the module lid 216 may tend to bow more to one side than a module lid from a second manufacturer. In this case, the protruding features 220 may be incorporated onto the module lid mating surface 222 in a particular "strategic" pattern when the module lid 216 is from the first manufacturer, and the protruding features 220 may be incorporated onto the module lid mating surface 222 in a different "strategic" pattern when the module lid 216 is from the second manufacturer.

Thus, FIG. 2 illustrates a first example of a thermal interface material structure of the present disclosure in which protruding features are incorporated onto a module lid mating surface. In the example of FIG. 2, the features protrude from the module lid mating surface into selected areas of an interface separating the module lid mating surface from a heat sink mating surface (e.g., into a central area of the interface). The protruding features may limit the relative movement of the mating surfaces in the selected areas during thermal cycling due to CTE mismatch. Limiting the relative movement may reduce strain on the thermal interface material in areas of the interface proximate to the protruding features. Reducing the strain on the thermal interface material may reduce the potential for TIM pump-out and the associated increase in thermal resistance due to loss of material from the interface.

Figure 3:
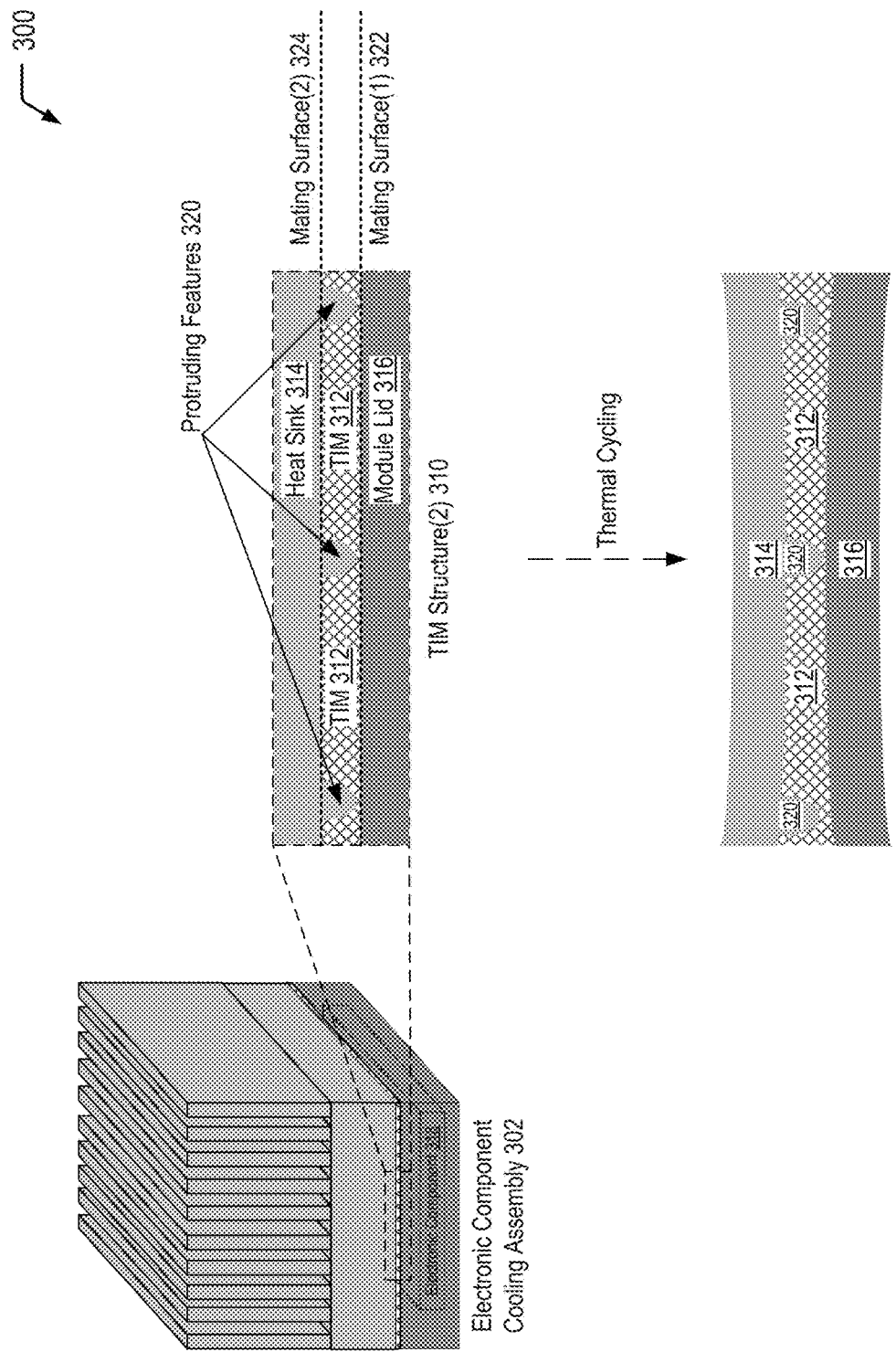
FIG. 3 is a diagram illustrating an example of a thermal interface material structure in which protruding features are incorporated onto a heat sink mating surface in order to reduce pump-out of thermal interface material by preventing excessive relative movement during thermal cycling, according to one embodiment.

Referring to FIG. 3, a diagram 300 illustrates an electronic component cooling assembly 302 that includes an example of a second TIM structure 310 of the present disclosure (identified as "TIM Structure(2)" in FIG. 3), according to one embodiment. The electronic component cooling assembly 302 is illustrated in a perspective view on the left side of FIG. 3, and a selected portion of the electronic component cooling assembly 302 that includes the second TIM structure 310 is illustrated in a cross-sectional view on the right side of FIG. 3. The cross-sectional view illustrates that the second TIM structure 310 includes a thermal interface material 312 (e.g., a thermal grease or putty) that forms an interface between a heat sink 314 and a module lid 316. The perspective view illustrates that the module lid 316 corresponds to a heat spreader surrounding an electronic component 318 that distributes heat generated by the electronic component 318 during operation. To illustrate, the electronic component 318 may include a die, a CPU, a GPU, or an FPGA, among other alternatives. The second TIM structure 310 of FIG. 3 represents an example in which protruding features 320 (also referred to herein as "bumps") are incorporated onto a heat sink mating surface 324 (identified as "Mating Surface(2)" in FIG. 3) in order to reduce or eliminate pump-out of the thermal interface material 312 by preventing excessive relative movement of the module lid 316 and the heat sink 314 during thermal cycling, such as the excessive relative movement depicted in the prior art diagram 100 of FIG. 1. Alternatively or additionally, protruding features may be incorporated onto a module lid mating surface 322 (identified as "Mating Surface(1)" in FIG. 3), as previously described herein with respect to the first TIM structure 210 of FIG. 2.

In the particular embodiment depicted in FIG. 3, the protruding features 320 are incorporated onto the heat sink 314 and protrude out from the heat sink mating surface 324 into selected areas of the interface between the heat sink mating surface 324 and the module lid mating surface 322. In a particular embodiment, the protruding features 320 may be incorporated onto the heat sink 314 through a forming process during manufacturing of the heat sink 314. In another embodiment, channels may be machined or otherwise incorporated into the heat sink 314, and the channels may be filled with a material that is appropriate for the heat sink 314 in order to form the protruding features 320. In some cases, the heat sink 314 may be formed from a heat sink material, such as an aluminum-based material or a copper-based material, among other alternative materials. As an illustrative, non-limiting example, when the heat sink 314 is formed from an aluminum-based material, the channels may be filled with an aluminum-based material that is the same as the aluminum-based material of the heat sink 314 or that is substantially similar to the aluminum-based material of the heat sink 314. Alternatively, with respect to the example in which the heat sink 314 is formed from an aluminum-based material, the channels may be filled with other material(s) compatible with the aluminum-based material for efficient transfer of heat to the heat sink 314.

The bottom portion of FIG. 3 illustrates that the protruding features 320 may prevent excessive relative movement of the module lid 316 and the heat sink 314 during power or thermal cycling. In the particular embodiment illustrated in FIG. 3, the protruding features 320 are positioned in a central area of the interface separating the module lid 316 and the heat sink 314. During thermal cycling, the module lid 316 may bow upward into the central area of the interface, and the heat sink 314 may bow downward into the central area of the interface. As previously described herein with respect to the prior art diagram 100 of FIG. 1, this may result in a significant reduction of interface thickness in the central area. By positioning the protruding features 320 in the central area of the interface, the potential reduction of interface thickness in the central area is limited by a distance that the protruding features 320 extend into the interface from the heat sink mating surface 324.

FIG. 3 depicts an illustrative, non-limiting example in which the protruding features 320 include three protruding features that are distributed substantially uniformly along the heat sink mating surface 324 in the central area of the interface. Further, FIG. 3 illustrates an example in which each of the protruding features 320 has a substantially similar shape (e.g., a bump shape). It will be appreciated that the number of protruding features 320, the position/distribution of protruding features 320 on the heat sink mating surface 314, the size/shape of each of the protruding features 320, or a combination thereof, may vary. As an example, in some cases, the protruding features 320 may be "strategically" patterned based on characteristics of the individual components of the electronic component cooling assembly 302, such as characteristics of the heat sink 314 and/or characteristics of the module lid 316, among other possible factors.

Thus, FIG. 3 illustrates a second example of a thermal interface material structure of the present disclosure in which protruding features are incorporated onto a heat sink mating surface. In the example of FIG. 3, the features protrude from the heat sink mating surface into selected areas of an interface separating the heat sink mating surface from the module lid mating surface from a (e.g., into a central area of the interface). The protruding features may limit the relative movement of the mating surfaces in the selected areas during thermal cycling due to CTE mismatch. Limiting the relative movement may reduce strain on the thermal interface material in areas of the interface proximate to the protruding features. Reducing the strain on the thermal interface material may reduce the potential for TIM pump-out and the associated increase in thermal resistance due to loss of material from the interface.

Figure 4:
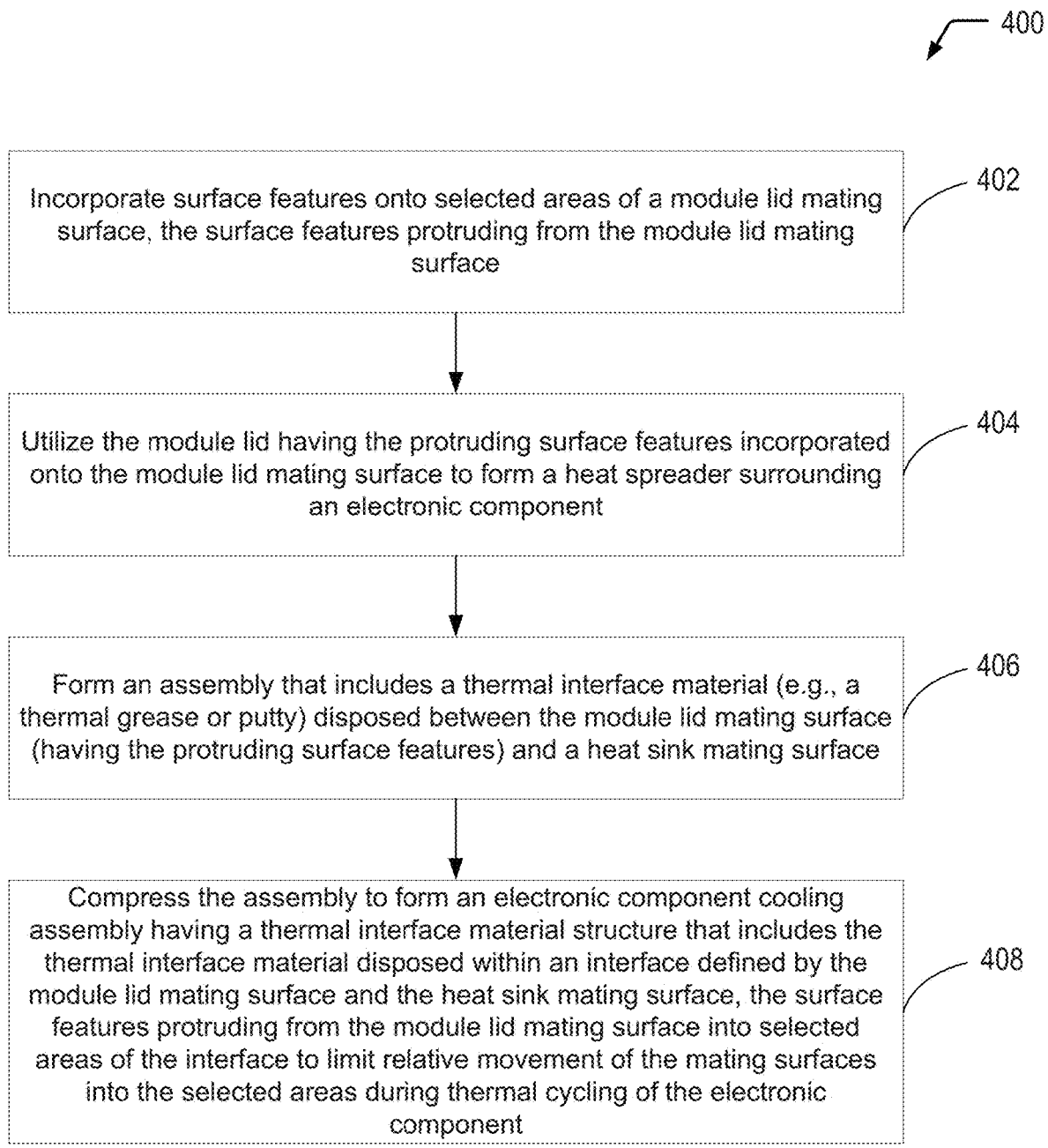
FIG. 4 is a flow diagram depicting a particular embodiment of a process of forming a thermal interface material structure having surface features incorporated onto a module lid mating surface to prevent excessive relative movement of mating surfaces during thermal cycling in order to reduce pump-out of thermal interface material.

Referring to FIG. 4, a flow diagram illustrates a particular embodiment of a process 400 of forming a thermal interface material structure having protruding surface features incorporated onto selected areas of a module lid mating surface to prevent excessive relative movement of mating surfaces during thermal cycling in order to reduce pump-out of thermal interface material. In the particular embodiment depicted in FIG. 4, the process 400 further includes forming an electronic component cooling assembly that includes the thermal interface material structure. It will be appreciated that the operations shown in FIG. 4 are for illustrative purposes only and that the operations may be performed in alternative orders, at alternative times, by a single entity or by multiple entities, or a combination thereof. For example, one entity may incorporate surface features onto selected areas of a module lid, while the same entity or a different entity may utilize the module lid (having the protruding surface features) to form a heat spreader surrounding an electronic component. In some cases, another entity may form an assembly by disposing the thermal interface material (e.g., a thermal grease or putty) on the module lid mating surface (including the protruding surface features) and disposing the heat sink mating surface on the thermal interface material, while the same entity or a different entity may compress the assembly to form the electronic component cooling assembly that includes the thermal interface material structure.

The process 400 includes incorporating surface features onto selected areas of a first mating surface associated with a module lid, at 402. The surface features protrude from the first mating surface. For example, referring to the first TIM structure 210 depicted in FIG. 2, the module lid 216 may have the protruding features 220 incorporated onto the module lid mating surface 222. In some cases, the protruding features 220 may be formed during formation of the module lid 216. In other cases, while not shown in the example of FIG. 2, after formation of the module lid 216 (having the module lid mating surface 222), channels may be machined into the module lid mating surface 222, and the channels may be filled with a material that is appropriate for the particular module lid material (e.g., a nickel-based material, in some cases)

In the particular embodiment depicted in FIG. 4, the process 400 includes utilizing the module lid having the protruding surface features incorporated onto the first mating surface to form a heat spreader surrounding an electronic component, at 404. Referring to FIG. 2, after incorporating the protruding features 220 onto the module lid mating surface 222, the module lid 216 (including the protruding features 220) may be used to form a heat spreader surrounding the electronic component 218. In other cases, the protruding features 220 may be formed on the module lid mating surface 222 after the module lid 216 has been utilized to form a heat spreader to surround the electronic component 218.

The process 400 also includes forming an assembly that includes a thermal interface material disposed between the module lid mating surface (having the protruding surface features) and a heat sink mating surface, at 406. The process further includes compressing the assembly to form an electronic component cooling assembly having a thermal interface material structure that includes the thermal interface material disposed within an interface defined by the module lid mating surface and the heat sink mating surface, at 408.

For example, referring to FIG. 2, the electronic component cooling assembly 202 may be formed by compressing an assembly that includes the thermal interface material 212 disposed between the module lid mating surface 222 (having the protruding features 220) and the heat sink mating surface 224. The right side of FIG. 2 illustrates that, after compression, the electronic component cooling assembly 202 includes the first TIM structure 210 in which the thermal interface material 212 is disposed within an interface defined by the module lid mating surface 222 and the heat sink mating surface 222.

The bottom portion of FIG. 2 illustrates that the protruding features 220 may prevent excessive relative movement of the module lid 216 and the heat sink 214 during thermal cycling. In the particular embodiment illustrated in FIG. 2, the protruding features 220 are positioned in a central area of the interface separating the module lid 216 and the heat sink 214. During thermal cycling, the module lid 216 may bow upward into the central area of the interface, and the heat sink 214 may bow downward into the central area of the interface. As previously described herein with respect to the prior art diagram 100 of FIG. 1, this may result in a significant reduction of interface thickness in the central area. By positioning the protruding features 220 in the central area of the interface, the potential reduction of interface thickness in the central area is limited by a distance that the protruding features 220 extend into the interface from the module lid mating surface 222.

Thus, FIG. 4 illustrates an example of a process of forming a thermal interface material structure having protruding surface features incorporated onto selected areas of a module lid mating surface to prevent excessive relative movement of mating surfaces during thermal cycling in order to reduce pump-out of thermal interface material.

Figure 5:
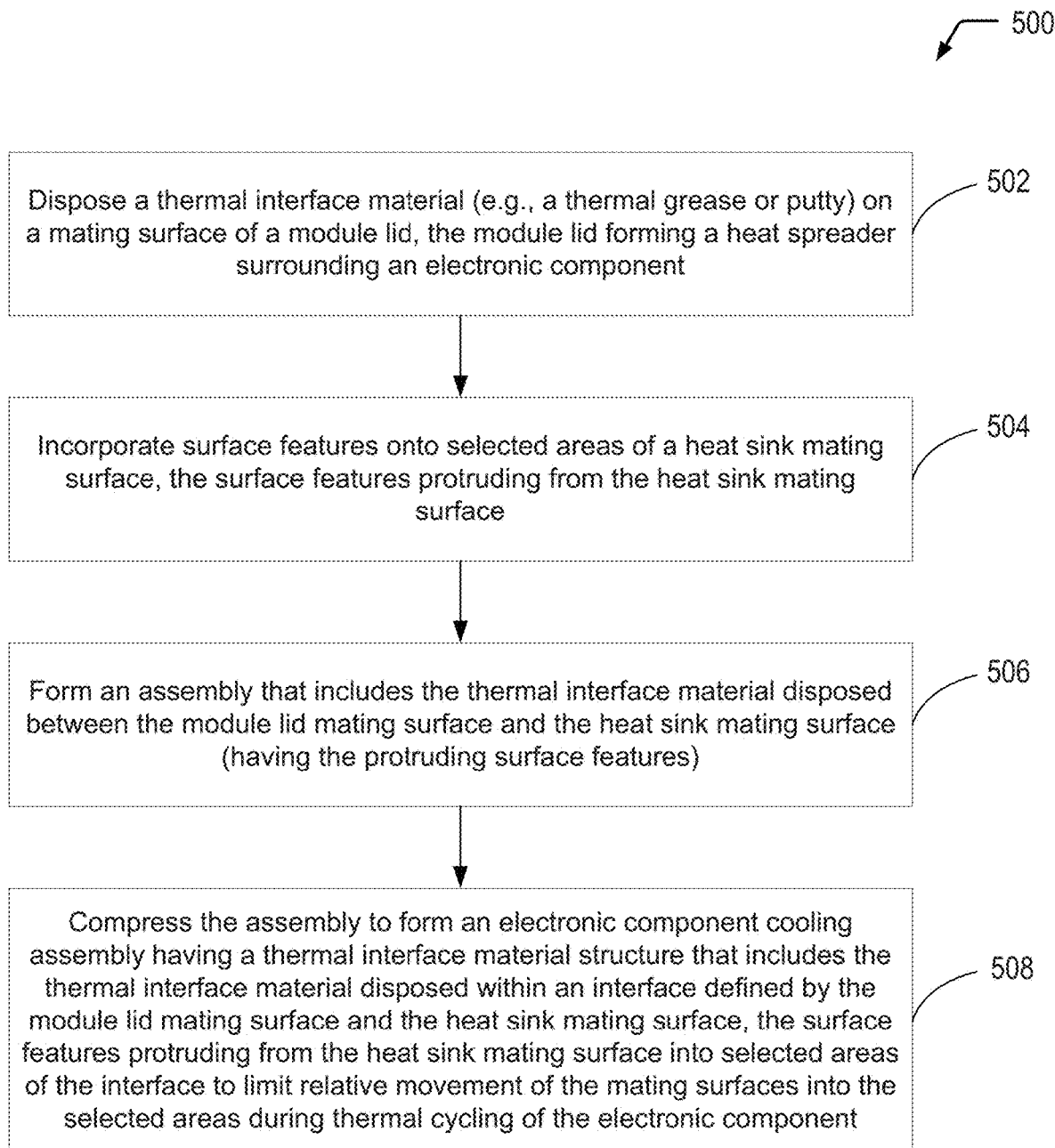
FIG. 5 is a flow diagram depicting a particular embodiment of a process of forming a thermal interface material structure having surface features incorporated onto a heat sink mating surface to prevent excessive relative movement of mating surfaces during thermal cycling in order to reduce pump-out of thermal interface material.

Referring to FIG. 5, a flow diagram illustrates a particular embodiment of a process 500 of forming a thermal interface material structure having protruding surface features incorporated onto selected areas of a heat sink mating surface to prevent excessive relative movement of mating surfaces during thermal cycling in order to reduce pump-out of thermal interface material. In the particular embodiment depicted in FIG. 5, the process 500 further includes forming an electronic component cooling assembly that includes the thermal interface material structure. It will be appreciated that the operations shown in FIG. 5 are for illustrative purposes only and that the operations may be performed in alternative orders, at alternative times, by a single entity or by multiple entities, or a combination thereof. For example, one entity may utilize a module lid to form a heat spreader surrounding an electronic component, while another entity may incorporate surface features onto selected areas of the heat sink mating surface. In some cases, another entity may form an assembly by disposing the thermal interface material (e.g., a thermal grease or putty) on the module lid mating surface and disposing the heat sink mating surface (including the protruding surface features) on the thermal interface material, while the same entity of a different entity may compress the assembly to form the electronic component cooling assembly that includes the thermal interface material structure.

The process 500 includes disposing a thermal interface material on a mating surface of a module lid, at 502. The module lid forms a heat spreader surrounding an electronic component. For example, referring to FIG. 3, the module lid 316 may form a heat spreader surrounding the electronic component 318, and the thermal interface material 312 may be disposed on the module lid mating surface 322.

The process 500 includes incorporating surface features onto selected areas of a heat sink mating surface, at 504. The surface features protrude from the heat sink mating surface. For example, referring to the second TIM structure 310 depicted in FIG. 2, the heat sink 314 may have the protruding features 320 incorporated onto the heat sink mating surface 324. In some cases, the protruding features 320 may be formed during formation of the heat sink 314. In other cases, while not shown in the example of FIG. 3, after formation of the heat sink (having the heat sink mating surface 324), channels may be machined into the heat sink mating surface 324, and the channels may be filled with a material that is appropriate for the particular heat sink material (e.g., an aluminum-based material, in some cases).

The process 500 also includes forming an assembly that includes the thermal interface material disposed between the module lid mating surface and the heat sink mating surface (having the protruding surface features), at 506. The process further includes compressing the assembly to form an electronic component cooling assembly having a thermal interface material structure that includes the thermal interface material disposed within an interface defined by the module lid mating surface and the heat sink mating surface, at 508.

For example, referring to FIG. 3, the electronic component cooling assembly 302 may be formed by compressing an assembly that includes the thermal interface material 312 disposed between the module lid mating surface 322 the heat sink mating surface 324 (having the protruding features 320). The right side of FIG. 3 illustrates that, after compression, the electronic component cooling assembly 302 includes the second TIM structure 310 in which the thermal interface material 312 is disposed within an interface defined by the module lid mating surface 322 and the heat sink mating surface 324.

The bottom portion of FIG. 3 illustrates that the protruding features 320 may prevent excessive relative movement of the module lid 316 and the heat sink 314 during thermal cycling. In the particular embodiment illustrated in FIG. 3, the protruding features 320 are positioned in a central area of the interface separating the module lid 316 and the heat sink 314. During thermal cycling, the module lid 316 may bow upward into the central area of the interface, and the heat sink 314 may bow downward into the central area of the interface. As previously described herein with respect to the prior art diagram 100 of FIG. 1, this may result in a significant reduction of interface thickness in the central area. By positioning the protruding features 320 in the central area of the interface, the potential reduction of interface thickness in the central area is limited by a distance that the protruding features 320 extend into the interface from the heat sink mating surface 324.

Thus, FIG. 5 illustrates an example of a process of forming a thermal interface material structure having protruding surface features incorporated onto selected areas of a heat sink mating surface to prevent excessive relative movement of mating surfaces during thermal cycling in order to reduce pump-out of thermal interface material.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. An electronic component cooling assembly comprising:
   an electronic component;
   a module lid to form a heat spreader surrounding the electronic component, the module lid having machined channels, the machined channels having a module lid material fill, the module lid material fill including at least a nickel-based material and generating surface features of the module lid that protrude away from a module lid mating surface;
   a heat sink having a heat sink mating surface; and
   a thermal interface material that is a thermal grease and that is disposed within an interface between the module lid mating surface and the heat sink mating surface, wherein the surface features protrude away from the module lid mating surface into selected areas of the interface and make contact with the heat sink mating surface.

2. The electronic component cooling assembly of claim 1, wherein the module lid and the surface features include the nickel-based material, a copper-based material, an aluminum-based material, or any combination thereof.

3. The electronic component cooling assembly of claim 1, wherein the module lid is formed from a first material, and wherein the surface features are formed from a second material that is compatible with the first material for efficient transfer of heat from the module lid into the thermal interface material during operation of the electronic component.

4. The electronic component cooling assembly of claim 1, wherein the electronic component includes a die, a central processing unit, a graphics processing unit, or a field programmable gate array.

5. The electronic component cooling assembly of claim 1, wherein the surface features protrude away from the module lid mating surface into the selected areas of the interface to limit relative movement of the module lid mating surface, and wherein the surface features protrude away from the module lid mating surface making contact with the heat sink mating surface into the selected areas during thermal cycling of the electronic component in order to reduce migration of the thermal interface material out of the interface.

* * * * *